United States Patent [19]
Shima et al.

[11] Patent Number: 5,700,467
[45] Date of Patent: Dec. 23, 1997

[54] AMORPHOUS SILICON CARBIDE FILM AND PHOTOVOLTAIC DEVICE USING THE SAME

[75] Inventors: Masaki Shima, Uji; Norihiro Terada, Ikoma, both of Japan

[73] Assignee: Sanyo Electric Co. Ltd., Osaka-fu, Japan

[21] Appl. No.: 619,327

[22] Filed: Mar. 21, 1996

[30] Foreign Application Priority Data

Mar. 23, 1995 [JP] Japan .................................. 7-064171

[51] Int. Cl.⁶ ..................... H01L 31/075; H01L 31/0376
[52] U.S. Cl. .................... 136/249; 252/62.3; 252/501.1; 252/504; 136/258; 257/55; 257/63; 257/77; 257/440; 257/458
[58] Field of Search ..................... 252/62.3, 501.1, 252/504; 136/249 TJ, 258 AM; 257/55, 63, 77, 440, 458

[56] References Cited

U.S. PATENT DOCUMENTS

| | | |
|---|---|---|
| 4,847,215 | 7/1989 | Hanaki et al. ............... 437/100 |
| 5,358,755 | 10/1994 | Li et al. ............... 427/577 |
| 5,362,684 | 11/1994 | Saito et al. ............... 437/234 |
| 5,419,783 | 5/1995 | Noguchi et al. ............... 136/258 AM |

OTHER PUBLICATIONS

R.E. Hollingsworth et al, *Conference Record, 19th IEEE Photovoltaic Specialists Conf.* (1987), pp. 684–688.

Japanese Journal of Applied Physics, vol. 30, No. 5, May 1991, pp. 1008–1014, "Interference–Free Determination of the Optical Absorption Coefficient and the Optical Gap of Amorphous Silicon Thin Films", Hishikawa et al.

J. Applied Physics, vol. 60, No. 11, Dec. 1, 1986, pp. 4025–4027, "Preparation of highly photosensitive hydrogenated amorphous Si–C alloys from a glow–discharge plasma", Matsuda et al.

*Primary Examiner*—Aaron Weisstuch
*Attorney, Agent, or Firm*—Nikaido, Marmelstein, Murray & Oram LLP

[57] ABSTRACT

In the present invention, the optical band gap Eg (eV) of an amorphous silicon carbide film has the following relationship with the content of hydrogen $C_H$ (at. %) and the content of carbon $C_C$ (at. %) in the film:

$$Eg = a + bC_H/100 + cC_C/100,$$

where a, b, and c are respectively in the ranges of $1.54 \leq a \leq 1.60$, $0.55 \leq b \leq 0.65$, and $-0.65 \leq c \leq -0.55$, whereby the defect density in the amorphous silicon carbide film can be significantly reduced.

9 Claims, 4 Drawing Sheets

AMORPHOUS SILICON CARBIDE FILM AND PHOTOVOLTAIC DEVICE USING THE SAME

BACKGROUND OF THE INVENTION

1. Field of the Invention

The present invention relates to an amorphous silicon carbide (hereinafter referred to as a - SiC) film used for a photovoltaic device such as a solar cell or a light sensor, and a photovoltaic device using the same.

2. Description of the Prior Art

It is necessary that a photovoltaic device represented by a solar cell or a light sensor can sufficiently absorb incident light in a desired wavelength region in order to improve light sensitivity.

Particularly in a solar cell, it is important to select a material having light absorption characteristics covering the wavelength region included in incident light. The reason why an amorphous semiconductor material has been commonly used as a semiconductor material for solar cells in recent years is that the light absorption characteristics of the amorphous semiconductor material can be controlled relatively easily by changing the composition thereof.

The most typical example of the amorphous semiconductor material is an amorphous silicon (hereinafter referred to as a - Si) film. FIG. 3 is a diagram showing the device structure of a photovoltaic device composed of an a-Si film. A transparent conductive film 2 composed of ITO (Indium-Tin Oxide), $SnO_2$ or the like is provided on a substrate 1 composed of glass or the like which is a supporting member of the photovoltaic device. The transparent conductive film 2 introduces incident light through the substrate 1 into a power generating portion, and functions as one electrode of the photovoltaic device. A power generating portion SC is provided on the transparent conductive film 2. The power generating portion SC is constituted by a laminated body of a p-type layer p composed of p-type a - Si, an i-type layer i composed of intrinsic a - Si, and an n-type layer n composed of n-type a - Si. A metal electrode 3 composed of aluminum, chromium, or the like is provided on the power generating portion SC. The metal electrode 3 is the other electrode of the photovoltaic device.

According to the photovoltaic device, the incident light passing through the substrate 1 is mainly absorbed by the i-type layer i, to generate electrons and holes, and the electrons and holes are respectively output from the metal electrode 3 and the transparent conductive film 2 by an internal electric field formed by the p-type layer p and the n-type layer n.

FIG. 4 is a diagram showing the device structure of another photovoltaic device. The above-mentioned photovoltaic device absorbs light in only one power generating portion, while this photovoltaic device is characterized by having three power generating portions SC1, SC2, and SC3, and intrinsic amorphous semiconductor materials having different light absorbing characteristics are used for the respective power generating portions.

In the photovoltaic device having this structure, a material having a wide optical band gap is used for an i-type layer i1 of the first power generating portion SC1 on the side of light incidence, and a material having a narrow optical band gap is used for an i-type layer i3 of the third power generating portion SC3 on the side of light transmission in order to absorb light in a wider wavelength region. A material having an optical band gap intermediate between the optical band gap widths of the i-type layer i1 and the i-type layer i3 is used for an i-type layer i2 of the second power generating portion SC2 positioned between the first and third power generating portions SC1 and SC3. In FIG. 4, the same materials as those shown in FIG. 3 are assigned the same reference numerals and hence, the description thereof is not repeated.

By such a construction, incident light passing through the substrate 1 is first absorbed by the first power generating portion SC1, after which light which is not absorbed by the power generating portion SC1 is absorbed by the second power generating portion SC2. Further, light which is not absorbed by the second power generating portion SC2 is absorbed by the third power generating portion SC3. As a result, the photovoltaic device can absorb light in a wider wavelength region, as compared with the photovoltaic device which absorbs light only by one power generating portion, whereby the conversion efficiency can be improved.

Such a photovoltaic device constructed by laminating a plurality of power generating portions is generally referred to as a multi-junction solar cell, as described in detail in U.S. Pat. No. 4,479,028.

In the multi-junction solar cell, amorphous silicon carbide (a - SiC) having an optical band gap which is made wider than that of a - Si by adding carbon is used as the intrinsic amorphous semiconductor material having a wide optical band gap which is used for the i-type layer i1 on the side of incident light.

FIG. 5 is a diagram showing the device structure of still another photovoltaic device. The photovoltaic device is characterized in that a buffer layer b is provided at the interface of a p-type layer p and an i-type layer i. A material having an optical band gap intermediate the optical band gap widths of the p-type layer p and the i-type layer i is used for the buffer layer b. By such construction, the recombination of electrons and holes at the interface can be restrained, whereby the conversion efficiency can be improved. In FIG. 5, the same materials as those shown in FIG. 3 are assigned the same reference numerals and hence, the description thereof is not repeated.

Also, in the photovoltaic device having this structure, intrinsic amorphous silicon carbide is used as a material of the buffer layer b.

FIG. 6 is a diagram showing the device structure of a further photovoltaic device. The photovoltaic device is characterized in that in a multi-junction solar cell constructed by laminating a plurality of power generating portions, a buffer layer is provided at the interface of a p-type layer and an i-type layer of each of the power generating portions.

In the photovoltaic device having this structure, a material having a wide optical band gap is used for an i-type layer i1 of a first power generating portion SC1 on the side of light incidence, and a buffer layer b1 using a material having an optical band gap width intermediate the optical band gap widths of a p-type layer p1 and the i-type layer i1 is provided at the interface of the p-type layer p1 and the i-type layer i1 in order to absorb light in a wider wavelength region. A material having a narrow optical band gap is used for an i-type layer i3 of a third power generating portion SC3 on the side of light transmission, and a buffer layer b3 using a material having an optical band gap intermediate the optical band gaps of a p-type layer p3 and the i-type layer i3 is provided at the interface of the p-type layer p3 and the i-type layer i3. A material having an optical band gap intermediate the optical band gaps of the i-type layer i1 and the i-type layer i3 is used for an i-type layer i2 of a second power generating portion SC2 positioned between the first and third power generating portions SC1 and SC3, and a buffer layer b2 using a material having an optical band gap intermediate the optical band gaps of a p-type layer p2 and the i-type layer i2 is provided. Consequently, the optical band gaps (Ebi (i=1 to 3) of the respective buffer layers b1, b2 and b3 satisfy the relationship of Eb1≧Eb2≧Eb3. In FIG. 6, the same materials as those shown in FIG. 4 are assigned the same reference numerals and hence, the description thereof is not repeated.

Also, in the photovoltaic device having this structure, intrinsic amorphous silicon carbide is used as a material of the buffer layers b1, b2, and b3.

By such a construction, the conversion efficiency can be further improved by the effect of the multi-junction solar cell and the effect of restraining the recombination of electrons and holes at the interfaces.

The amorphous semiconductor material has the advantage in that the optical band gap can be changed by adding carbon, germanium, or the like to the a - Si film, while having the disadvantage in that the quality of the film is degraded by adding the element, as compared with the quality of the a - Si film having no element added thereto.

The conceivable reason for this is that in a hydrogenated amorphous silicon thin film or hydrogenated amorphous silicon alloy thin film to which carbon, germanium, or the like is added, the content of hydrogen in the film and the bonding configuration between hydrogen and the other element are changed by adding the element.

In the a - Si film, the added carbon exerts a slight change on the content of hydrogen in the film and the bonding configuration between hydrogen and the other element, whereby control of the elements becomes complicated.

In order to solve such a problem, a method of forming an a - SiC film under conditions of high hydrogen dilution using a raw material gas obtained by diluting silane ($SiH_4$) by several tens of times with hydrogen ($H_2$) to improve the quality of the film has been proposed (A. Matsuda et al., *Journal of Applied Physics*, 60 (1986) 4025).

According to this conventional method, however, the film is formed by making the content of $H_2$ in the raw material gas used for film formation larger than the content of $SiH_4$, whereby the film forming speed is reduced, and the productivity is decreased.

Furthermore, it is difficult to control the content of hydrogen in the film and the bonding configuration between hydrogen and the other element independently of the carbon content, whereby an ultimate solution is not reached.

SUMMARY OF THE INVENTION

The present invention has been made in order to overcome the above-mentioned conventional disadvantages and gas for its object to provide an a - SiC film in which the defect density can be significantly reduced.

Another object of the present invention is to provide a photovoltaic device using the a - SiC film as an intrinsic amorphous semiconductor material.

An a - SiC film according to the present invention is characterized in that the optical band gap Eg (eV) of the film has the following relationship with the content of hydrogen $C_H$ (at. %) and the content of carbon $C_C$ (at. %) in the film:

$$Eg=a+bC_H/100+cC_C/100,$$

where a, b, and c are respectively in the ranges of $1.54 \leq a \leq 1.60$, $0.55 \leq b \leq 0.65$, and $-0.65 \leq c \leq -0.55$.

The optical band gap of the a - Si film according to the present invention, and the content of hydrogen and the content of carbon in the film are maintained in a predetermined relationship, whereby the defect density in the film can be significantly reduced.

The present invention is characterized in that the content of hydrogen $C_H$ in the film is in the range of 10 to 30 at. %.

A photovoltaic device according to the present invention is characterized by comprising a power generating portion which is constituted by a p-type amorphous semiconductor layer, an i-type amorphous semiconductor layer, and an n-type amorphous semiconductor layer, and in that the a - SiC film according to the present invention is used as the i-type amorphous semiconductor layer.

Furthermore, a photovoltaic device according to the present invention is characterized by comprising a power generating portion which is constituted by a p-type amorphous semiconductor layer, an i-type amorphous semiconductor layer, and an n-type amorphous semiconductor layer, and in that a buffer layer composed of an intrinsic amorphous semiconductor material is provided between the p-type amorphous semiconductor layer and the i-type layer, and the a - SiC film according to the present invention is used as the buffer layer.

Additionally, a photovoltaic device according to the present invention is characterized in that a plurality of power generating portions each of which is constituted by a p-type amorphous semiconductor layer, an i-type amorphous semiconductor layer, and an n-type amorphous semiconductor layer are laminated, and the a - SiC film according to the present invention is used as the i-type amorphous semiconductor layer of the power generating portion positioned on the side of light incidence.

As described in the foregoing, the a - SiC film according to the present invention is used as a material of the intrinsic amorphous semiconductor layer in the photovoltaic device, whereby it is possible to increase the conversion efficiency of the photovoltaic device either in an initial stage or after light irradiation for a long time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
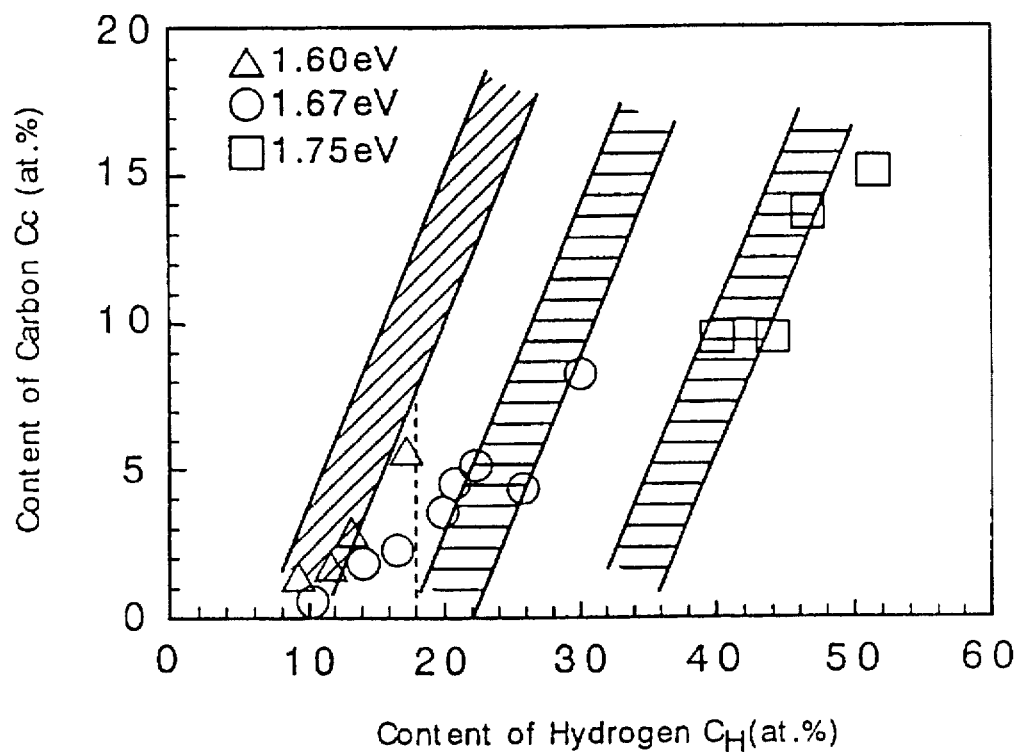
FIG. 1 is a characteristic graph showing the content of hydrogen and the content of carbon in an a - SiC film according to the present invention.

FIG. 1 is a characteristic graph for explaining an a - SiC film according to the present invention. FIG. 1 illustrates a combination of the content of hydrogen and the content of carbon in each of three types of a - SiC films having approximately the same optical band gap, that is, 1.60 eV, 1.67 eV, and 1.75 eV. In FIG. 1, the horizontal axis represents the content of hydrogen, and the vertical axis represents the content of carbon. The a - SiC film having the optical band gap of 1.60 eV is indicated by △, the a - SiC film having the optical band gap of 1.67 eV is indicated by ○, and the a - SiC film having the optical band gap of 1.75 eV is indicated by □.

As a method of forming the a - SiC film, a plasma CVD method is used. The formation conditions of the a - SiC film, which is a sample to be measured in FIG. 1, are shown in Table 1.

TABLE 1

| substrate temperature | 150 to 350° C. |
|---|---|
| RF power density | 35 mW/cm$^2$ |
| reaction pressure | 30 Pa |
| raw material gas | SiH$_4$: 15 sccm |
| | CH$_4$: 6–40 sccm |
| | H$_2$: 90 sccm |

Secondary ion mass spectroscopy and X-ray photoelectron spectroscopy are used for measuring the carbon and hydrogen contents.

Figure 7:
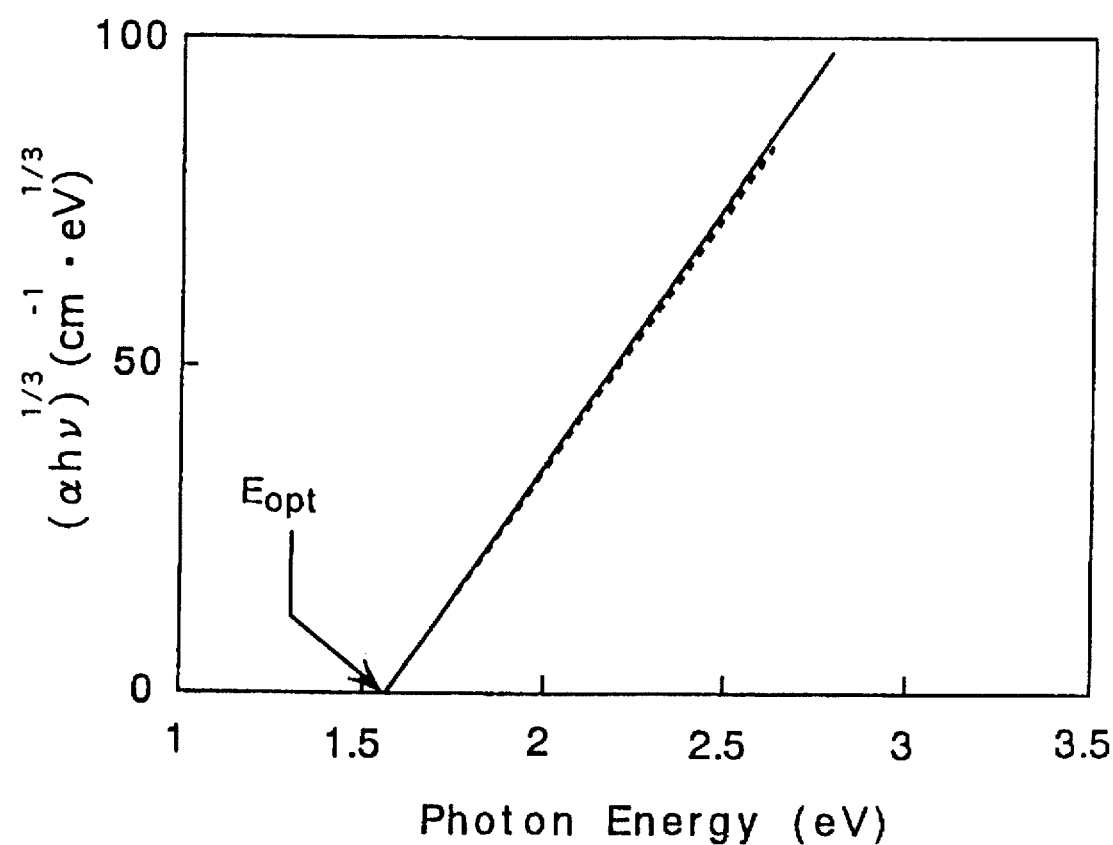
FIG. 7 is a plot of photon energy of an a - Si:H film versus $(\alpha \cdot h \nu)^{1/3}$.

The optical band gap width is derived from the relationship of a plot of $(\alpha h\nu)^{1/3}$ versus hv. The method of deriving the optical band gap will be described. In order to calculate the optical band gap, a hydrogenated amorphous silicon thin film or hydrogenated amorphous silicon alloy thin film to be measured is first formed on a glass substrate having a flat surface, to precisely measure the transmittance spectrum (T) and the reflectance spectrum (R) of the film, respectively, using a spectrophotometer. T/(1−R) is calculated from the measured values in order to consider the effect of interference of light in the film, and T/(1−R) found from a theory by assuming a thickness d and a refractive index n is made to fit the results of the calculation, to calculate a thickness d, a refractive index n, and an optical absorption coefficient spectrum ($\alpha$). $(\alpha \cdot h\nu)^{1/3}$ is calculated from the experimentally found optical absorption coefficient spectrum and the corresponding photon energy (hv) and is plotted against hv, to obtain FIG. 7. In FIG. 7, a straight line is drawn through the calculated values, the intersection with hv on the horizontal axis being taken as the optical band gap $E_{opt}$ (eV). This method makes it possible to determine the optical band gap $E_{opt}$ with less error and more accurately, as compared with the conventional method of finding $E_{opt}$ from $(\alpha \cdot h\nu)^{1/2}$ versus hv, for example. This relationship is described in detail in Y. Hishikawa et al., *Japanese Journal of Applied Physics*, 30 (1991) pp. 1008–1014 "Interference—Free Determination of the Optical Absorption Coefficient and the Optical Gap of Amorphous Silicon Thin Films".

It is noted in FIG. 1 that various combinations of the content of hydrogen and the content of carbon in the film are possible even if the optical band gap is the same. When the a - SiC film having an optical band gap of 1.67 eV, for example, is considered, various combinations of the hydrogen and carbon contents, for example, about 18% and about 2%, about 20% and about 4%, about 23% and about 5%, ... exist, as indicated by ○ in FIG. 1.

Specifically, the optical band gap Eg (eV) of the a - SiC film according to the present invention can be represented by the following equation through multiple regression analysis, as indicted by the hatched area in FIG. 1, using the content of hydrogen $C_H$ (at. %) and the content of carbon $C_C$ (at. %) in the film:

$$Eg = a + bC_H/100 + cC_C/100 \quad (1)$$

where $1.54 \leq a \leq 1.60$ $0.55 \leq b \leq 0.65$ $-0.65 \leq c \leq -0.55$

In this case, Eg is an optical band gap derived from the above-mentioned relationship of the plot of $(\alpha h\nu)^{1/3}$ versus hv.

The equation (1) also indicates that in a case where the content of hydrogen in the a - SiC film according to the present invention is constant, the optical band gap of the film is decreased if the content of carbon in the film is increased. Specifically, when the a - SiC film in which the content of hydrogen is approximately 18% (indicated by the dashed line in FIG. 1) is considered, the optical band gap of the film is decreased from 1.67 eV to 1.60 eV by an increase in the content of carbon from about 2% to 5%.

It has been conventionally considered that both the content of hydrogen and the content of carbon in the film have a positive correlation with the optical band gap. Specifically, it has been considered that if either one of the content of hydrogen and the content of carbon is increased, the optical band gap is increased.

On the other hand, the a - SiC film according to the present invention greatly differs from the conventional theory in that when the content of hydrogen in the film is approximately constant, the band gap of the film is decreased if the content of carbon is increased.

Figure 2:
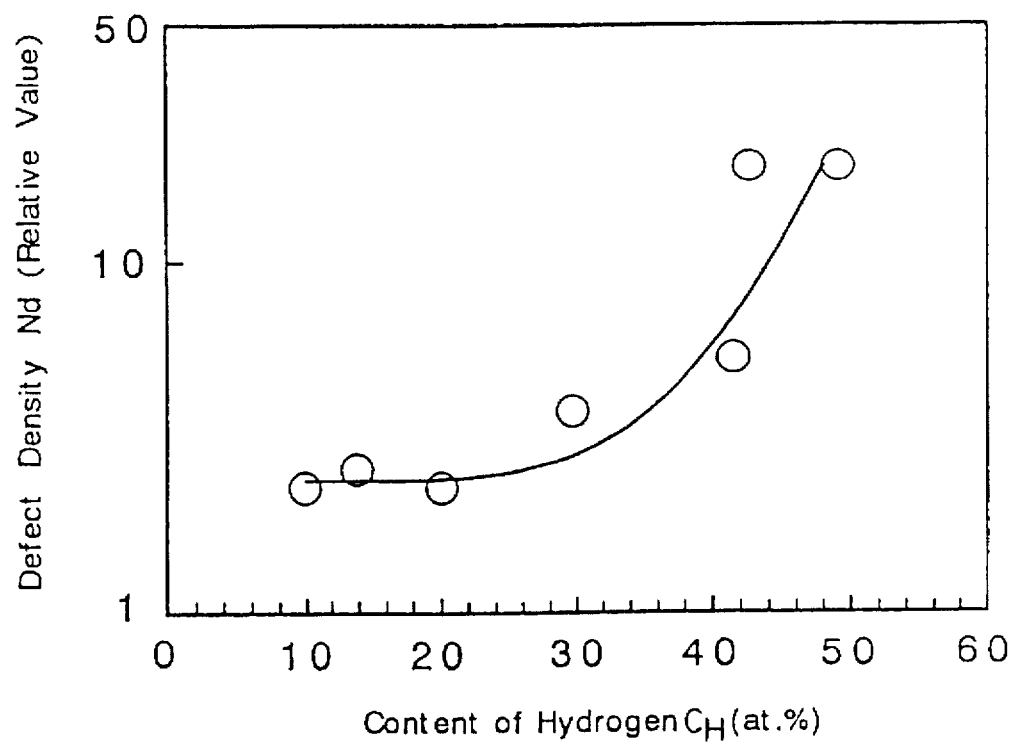
FIG. 2 is a characteristic graph showing the defect density of the a - SiC film according to the present invention plotted against the content of hydrogen in the film.

FIG. 2 illustrates the results obtained in measuring the defect density ($N_d$) in an a - SiC film having an optical band gap of 1.67 to 1.71 eV. The horizontal axis represents the same content of hydrogen as that in FIG. 1, and the vertical axis represents the defect density in the film which is measured by a constant photocurrent method, and is indicated by a relative value.

In FIG. 2, the defect density is approximately constant in a region where the content of hydrogen is increased in the range of 10 to 30 at. %, and is rapidly increased in a region where the content of hydrogen exceeds approximately 30 at. %.

In the a - SiC film having an optical band gap of 1.67 to 1.71 eV, therefore, the defect density in the film can be significantly decreased by setting the content of hydrogen in the range of 10 to 30 at. %. The content of carbon at this time is in the range of 1 to 7 at. %.

Similarly with respect to a - SiC films having the other optical band gaps, the relationship between the defect density and the content of hydrogen in each of the films can be examined. As a result, the range of the content of hydrogen which is effective in decreasing the defect density is the same as the above-mentioned results.

As descried in the foregoing, the defect density in an a - SiC film can be decreased by keeping the relationship between the optical band gap Eg of the film and the content of hydrogen $C_H$ and the content of carbon $C_C$ in the film constant.

Figure 3:
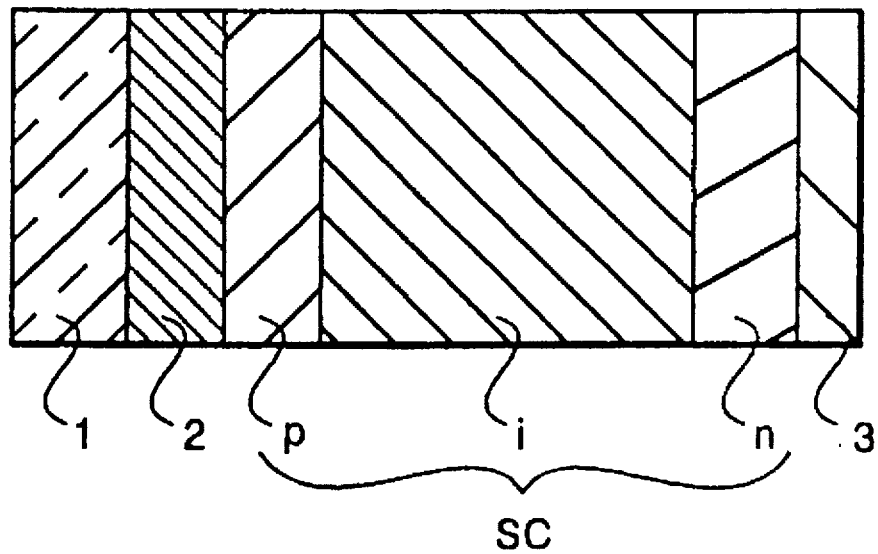
FIG. 3 is a cross-sectional view showing the structure of a photovoltaic device.

Furthermore, the a - SiC film having an optical band gap of 1.67 eV in the present invention can be used as an amorphous semiconductor material for the i-type layer i in the above-mentioned photovoltaic device shown in FIG. 3, to measure the conversion efficiency in initial stages and after light irradiation. An a - Si film having an optical band gap of 1.78 eV and an a - Si film having an optical band gap of 1.55 eV are respectively used for a p-type layer and an n-type layer. Table 2 shows the results thereof. The content of hydrogen and the content of carbon in the a - SiC film used herein are respectively about 20 at % and about 5 at. %.

TABLE 2

|  | present invention | conventional example |
|---|---|---|
| conversion efficiency at initial stage (%) | 7.4 | 7.4 |
| conversion efficiency after light irradiation (%) | 6.3 | 5.8 |

As shown in Table 2, the conversion efficiency of the photovoltaic device using the a - SiC film according to the present invention as the i-type layer is 7.4% in the initial stages, which is approximately the same as that of the photovoltaic device having the conventional structure using the a - Si film having an optical band gap of 1.67 eV for the i-type layer, while being 6.3% after light irradiation for a long time, which is higher than that of the photovoltaic device having the conventional structure.

Figure 4:
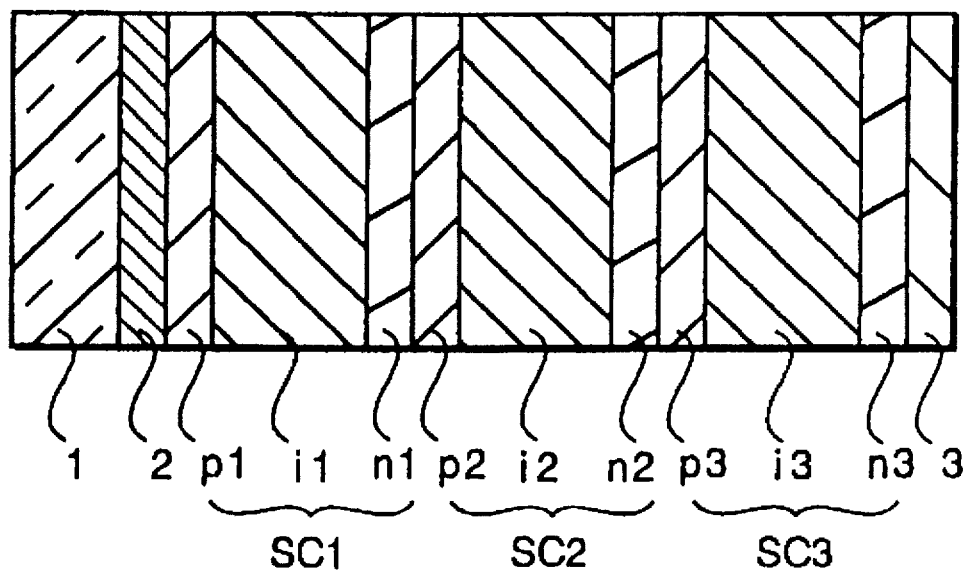
FIG. 4 is a cross-sectional view showing the structure of another photovoltaic device.

Furthermore, similarly in a case where the a - SiC film of the present invention having an optical band gap of 1.60 to 1.80 eV is used for the i-type layer i1 on the side of light incidence in the above-mentioned photovoltaic device shown in FIG. 4, high conversion efficiency is obtained in either an initial stage or after light irradiation for a long time, as compared with the conventional example. A p-type a - SiC film having an optical band, gap of 1.70 to 1.85 eV is used for the p-type layers p1, p2, and p3, an n-type a - Si film having an optical band gap width of 1.50 to 1.60 eV is used for the n-type layers n1, n2, and n3, an a-Si film or an amorphous silicon-germanium (hereinafter referred to as a-SiGe) film having an optical band gap of 1.45 to 1.60 eV is used for the second i-type layer i2, and an a - SiGe film having an optical band gap of 1.30 to 1.45 eV is used for the third i-type layer i3.

Figure 5:
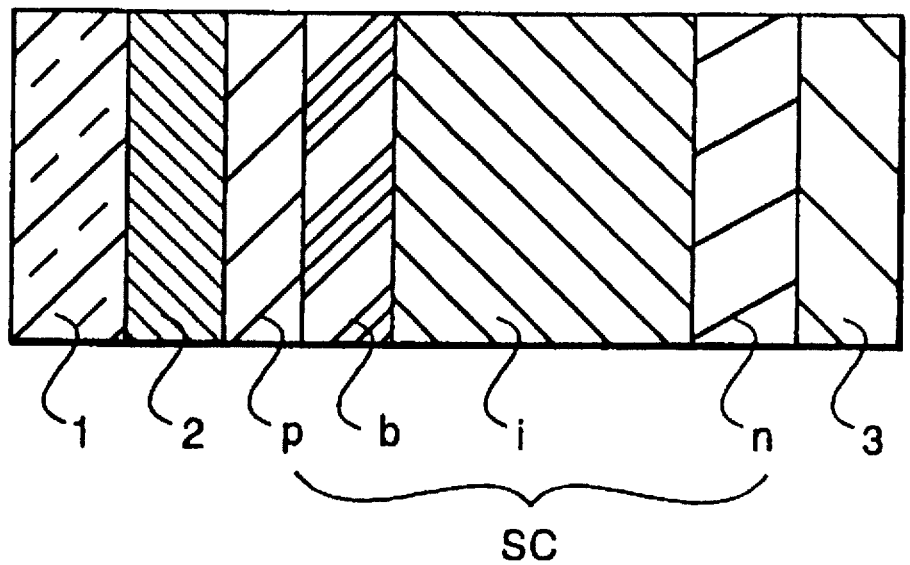
FIG. 5 is a cross-sectional view showing the structure of still another photovoltaic device.

Additionally, even in a case where the a - SiC film of the present invention having an optical band gap of 1.60 to 1.85 eV is used for the buffer layer b in the above-mentioned photovoltaic device shown in FIG. 5, the same effect is obtained. A p-type a - SiC film having an optical band gap of 1.70 to 1.85 eV and an n-type a - Si film having an optical band gap of 1.50 to 1.60 eV are respectively used for the p-type layer p and the n-type layer n.

Figure 6:
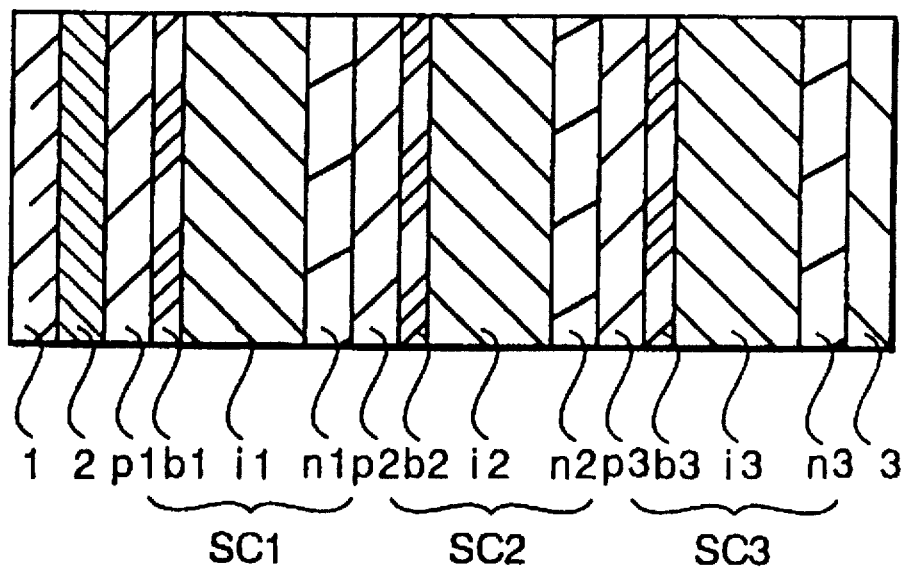
FIG. 6 is a cross-sectional view showing the structure of a further photovoltaic device.

Additionally, even in a case where the a - SiC film of the present invention having an optical band gap of 1.60 to 1.85 eV is used for the buffer layers b1, b2, and b3 in the above-mentioned photovoltaic device shown in FIG. 6, the same effect is obtained. The optical band gaps (Ebi (i=1 to 3)) of the buffer layers b1, b2, and b3 satisfy the relationship of Eb1≧Eb2≧Eb3. A p-type a - SiC film having an optical band gap of 1.70 to 1.85 eV and an n-type a - Si film having an optical band gap of 1.50 to 1.60 eV are respectively used for the p-type layers p1, p2, and p3 and the n-type layers n1, n2, and n3, and an a - Si film or an a - SiC film having an optical band gap of 1.60 to 1.80 eV, an a - Si film or an a - SiGe film having an optical band gap of 1.45 to 1.60 eV, and an a - SiGe film having an optical band gap of 1.30 to 1.45 eV are respectively used for the i1-type layer i1, the i2-type layer i2, and the i3-type layer i3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amorphous silicon carbide semiconductor, wherein the optical band gap Eg (eV) of the semiconductor has the following relationship with the content of hydrogen $C_H$ (at. %) and the content of carbon $C_C$ (at. %) in the semiconductor:

$$Eg = a + bC_H/100 + cC_C/100,$$

where a, b, and c are respectively in the ranges of $1.54 \leq a \leq 1.60$, $0.55 \leq b \leq 0.65$, and $-0.65 \leq c \leq -0.55$.

2. The amorphous silicon carbide semiconductor according to claim 1, wherein the content of hydrogen $C_H$ in said semiconductor is in the range of 10 to 30 at. %.

3. A photovoltaic device comprising a power generating portion comprising a p-type amorphous semiconductor layer, an i-type amorphous semiconductor layer, and an n-type amorphous semiconductor layer, wherein said i-type amorphous semiconductor layer comprises an amorphous silicon carbide film whose optical band gap Eg (eV) has the following relationship with the content of hydrogen $C_H$ (at. %) and the content of carbon $C_C$ (at. %) in the film:

$$Eg = a + bC_H/100 + cC_C/100,$$

where a, b, and c are respectively in the ranges of $1.54 \leq a \leq 1.60$, $0.55 \leq b \leq 0.65$, and $-0.65 \leq c \leq -0.55$.

4. The photovoltaic device according to claim 3, wherein the content of hydrogen $C_H$ in said amorphous silicon carbide film is in the range of 10 to 30 at. %.

5. A photovoltaic device comprising a power generating portion comprising a p-type amorphous semiconductor layer, an i-type amorphous semiconductor layer, and an n-type amorphous semiconductor layer, wherein a buffer layer comprising an intrinsic amorphous semiconductor material is provided between said p-type amorphous semiconductor layer and the i-type layer, and said buffer layer comprises an amorphous silicon carbide film whose optical band gap Eg (eV) has the following relationship with the content of hydrogen $C_H$ (at. %) and the content of carbon $C_C$ (at. %) in the film:

$$Eg = a + bC_H/100 + cC_C/100,$$

where a, b, and c are respectively in the ranges of $1.54 \leq a \leq 1.60$, $0.55 \leq b \leq 0.65$, and $-0.65 \leq c \leq -0.55$.

6. The photovoltaic device according to claim 5, wherein the content of hydrogen $C_H$ in said amorphous silicon carbide film is in the range of 10 to 30 at. %.

7. The photovoltaic device according to claim 5, wherein a plurality of power generating portions are laminated.

8. A photovoltaic device comprising a plurality of power generating portions laminated together, each portion comprising a p-type amorphous semiconductor layer, an i-type amorphous semiconductor layer, and an n-type amorphous semiconductor layer, wherein said i-type amorphous semiconductor layer of said power generating portion positioned on the side of light incidence comprises an amorphous silicon carbide film whose optical band gap Eg (eV) has the following relationship with the content of hydrogen $C_H$ (at. %) and the content of carbon $C_C$ (at. %) in the film:

$$Eg = a + bC_H/100 + cC_C/100,$$

wherein a, b, and c are respectively in the ranges of $1.54 \leq a \leq 1.60$, $0.55 \leq b \leq 0.65$, and $-0.65 \leq c \leq -0.55$.

9. The photovoltaic device according to claim 8, wherein the content of hydrogen $C_H$ in said amorphous silicon carbide film is in the range of 10 to 30 at. %.

* * * * *